United States Patent
Peng (10) Patent No.: US 10,872,762 B2
(45) Date of Patent: Dec. 22, 2020

(54) METHODS OF FORMING SILICON OXIDE LAYER AND SEMICONDUCTOR STRUCTURE

(71) Applicant: Taiwan Semiconductor Manufacturing Co., Ltd., Hsinchu (TW)

(72) Inventor: Yu-Yun Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 134 days.

(21) Appl. No.: 16/022,701

(22) Filed: Jun. 29, 2018

(65) Prior Publication Data

US 2019/0139757 A1 May 9, 2019

Related U.S. Application Data

(60) Provisional application No. 62/582,959, filed on Nov. 8, 2017.

(51) Int. Cl.
*H01L 21/762* (2006.01)
*H01L 21/324* (2006.01)
(Continued)

(52) U.S. Cl.
CPC ...... *H01L 21/02164* (2013.01); *C23C 16/401* (2013.01); *H01L 21/0228* (2013.01); *H01L 21/02208* (2013.01); *H01L 21/02216* (2013.01); *H01L 21/02219* (2013.01); *H01L 21/02222* (2013.01); *H01L 21/02274* (2013.01);
(Continued)

(58) Field of Classification Search
CPC ......... H01L 21/02164; H01L 21/02208; H01L 21/0228; H01L 21/02219; H01L 21/02274; H01L 21/02107; H01L 21/02216; H01L 21/02222; H01L 21/324; H01L 21/76224; H01L 21/76283; C23C 16/045;
(Continued)

(56) References Cited

U.S. PATENT DOCUMENTS 6,323,121 B1 * 11/2001 Liu .................. H01L 21/02063
257/E21.226
6,429,077 B1 * 8/2002 Tung .................. H01L 29/0847
438/270

(Continued)

OTHER PUBLICATIONS

"Thermal Atomic Layer Deposition of Device-Quality SiO2 Thin Films under 100 degree Using an Aminodisilane Precursor," Dae Hyun Kim, Han Jin Lee, Heonjong Jeong, Bonggeun Shong, Woo-Hee Kim, and Tae Joo Park, Hanyang University, Korea, Chemistry of Materials; 5502-5508 (Year: 2019).*

(Continued)

*Primary Examiner* — Maliheh Malek
(74) *Attorney, Agent, or Firm* — JCIPRNET (57) ABSTRACT

Methods of forming a silicon oxide layer and a semiconductor structure are disclosed. The method of forming the silicon oxide layer includes the following steps. A silicon-containing precursor, an oxygen-containing precursor and an oxygen radical are provided to form a silicon oxide layer containing water. A thermal process is performed on the silicon oxide layer to diffuse the water into the silicon oxide layer and oxidize the silicon oxide layer by using the water as oxidizer.

20 Claims, 5 Drawing Sheets

US 10,872,762 B2
Page 2

(51) Int. Cl.
*H01L 21/02* (2006.01)
*C23C 16/40* (2006.01)
*H01L 23/532* (2006.01)
*H01L 23/31* (2006.01)
*H01L 23/485* (2006.01)

(52) U.S. Cl.
CPC ...... *H01L 21/324* (2013.01); *H01L 21/76224* (2013.01); *H01L 21/76283* (2013.01); *H01L 23/3171* (2013.01); *H01L 23/3178* (2013.01); *H01L 23/3192* (2013.01); *H01L 23/5329* (2013.01); *H01L 23/485* (2013.01)

(58) Field of Classification Search
CPC .......... C23C 16/401–402; C23C 16/56; C23C 16/45523
See application file for complete search history.

(56) References Cited

U.S. PATENT DOCUMENTS

| | | | |
|---|---|---|---|
| 7,074,690 B1* | 7/2006 | Gauri | H01L 21/02164 438/428 |
| 7,148,155 B1* | 12/2006 | Tarafdar | H01L 21/02164 438/778 |
| 7,498,273 B2* | 3/2009 | Mallick | H01L 21/3122 438/308 |
| 7,521,378 B2* | 4/2009 | Fucsko | H01L 21/02236 438/781 |
| 7,524,735 B1* | 4/2009 | Gauri | H01L 21/31 438/436 |
| 7,541,297 B2* | 6/2009 | Mallick | C23C 16/045 257/E21.279 |
| 7,582,555 B1* | 9/2009 | Lang | H01L 21/02164 257/E21.263 |
| 7,803,722 B2* | 9/2010 | Liang | H01L 21/02167 438/787 |
| 7,825,038 B2* | 11/2010 | Ingle | H01L 21/31612 438/778 |
| 7,867,923 B2* | 1/2011 | Mallick | C23C 16/452 438/791 |
| 7,888,233 B1* | 2/2011 | Gauri | H01L 21/02164 438/436 |
| 7,943,531 B2* | 5/2011 | Nemani | H01L 21/02126 438/787 |
| 8,445,078 B2* | 5/2013 | Liang | C23C 16/56 427/579 |
| 8,580,697 B1* | 11/2013 | Lang | H01L 21/02271 438/761 |
| 8,629,067 B2* | 1/2014 | Liang | H01J 37/32357 438/791 |
| 8,685,867 B1* | 4/2014 | Danek | H01L 21/3105 438/787 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,257,302 B1* | 2/2016 | Wang | H01L 21/02126 |
| 9,390,914 B2* | 7/2016 | Wang | H01L 21/02343 |
| 9,520,482 B1 | 12/2016 | Chang et al. | |
| 9,576,814 B2 | 2/2017 | Wu et al. | |
| 9,607,837 B1* | 3/2017 | Namba | H01L 21/02211 |
| 9,786,542 B2* | 10/2017 | Chuang | H01L 21/76205 |
| 10,526,701 B2* | 1/2020 | Kumar | C23C 16/45542 |
| 2003/0040196 A1* | 2/2003 | Lim | H01L 21/3144 438/785 |
| 2006/0030165 A1* | 2/2006 | Ingle | H01L 21/02164 438/795 |
| 2006/0032442 A1* | 2/2006 | Hasebe | C23C 16/45546 118/715 |
| 2006/0046427 A1* | 3/2006 | Ingle | H01L 21/02129 438/424 |
| 2006/0046508 A1* | 3/2006 | Nemani | C23C 16/401 438/758 |
| 2007/0212850 A1* | 9/2007 | Ingle | C23C 16/402 438/435 |
| 2007/0281495 A1* | 12/2007 | Mallick | H01L 21/022 438/778 |
| 2007/0281496 A1* | 12/2007 | Ingle | C23C 16/452 438/778 |
| 2008/0026597 A1* | 1/2008 | Munro | C23C 16/401 438/788 |
| 2008/0081104 A1* | 4/2008 | Hasebe | C23C 16/402 427/58 |
| 2009/0061647 A1* | 3/2009 | Mallick | H01L 21/31633 438/773 |
| 2009/0104755 A1* | 4/2009 | Mallick | C23C 16/56 438/477 |
| 2009/0104789 A1* | 4/2009 | Mallick | C23C 16/045 438/788 |
| 2009/0104791 A1* | 4/2009 | Nemani | C23C 16/045 438/788 |
| 2010/0159711 A1* | 6/2010 | Venkataraman | C23C 16/401 438/787 |
| 2010/0248465 A1* | 9/2010 | Yi | H01L 21/02164 438/591 |
| 2010/0255218 A1* | 10/2010 | Oka | C23C 16/402 427/579 |
| 2011/0065288 A1* | 3/2011 | Harada | H01L 21/316 438/791 |
| 2011/0151677 A1* | 6/2011 | Wang | H01L 21/02343 438/773 |
| 2011/0159703 A1* | 6/2011 | Liang | H01L 21/0217 438/791 |
| 2012/0083133 A1* | 4/2012 | Solis | H01L 21/02219 438/761 |
| 2012/0142198 A1* | 6/2012 | Wang | H01L 21/02326 438/773 |
| 2012/0177846 A1* | 7/2012 | Li | C23C 16/308 427/579 |
| 2012/0196451 A1* | 8/2012 | Mallick | C23C 16/401 438/787 |
| 2012/0309205 A1* | 12/2012 | Wang | C23C 16/452 438/763 |
| 2012/0329286 A1* | 12/2012 | Takeda | H01L 21/02126 438/781 |
| 2013/0005154 A1* | 1/2013 | Lee | H01L 21/28202 438/763 |
| 2013/0115763 A1* | 5/2013 | Takamure | H01L 21/02271 438/513 |
| 2013/0230987 A1* | 9/2013 | Draeger | H01L 21/0217 438/694 |
| 2014/0051264 A1* | 2/2014 | Mallick | H01L 21/02164 438/786 |
| 2014/0120706 A1* | 5/2014 | Chen | H01L 21/76801 438/585 |
| 2014/0120738 A1* | 5/2014 | Jung | H01L 21/02219 438/778 |
| 2014/0242809 A1* | 8/2014 | Hashimoto | H01L 21/02126 438/778 |
| 2014/0302688 A1* | 10/2014 | Underwood | H01L 21/02216 438/786 |
| 2014/0302690 A1* | 10/2014 | Underwood | H01L 21/02126 438/787 |
| 2014/0349492 A1* | 11/2014 | Shimamoto | C23C 16/401 438/786 |
| 2015/0004806 A1* | 1/2015 | Ndiege | H01L 21/02164 438/789 |
| 2015/0014807 A1* | 1/2015 | Chuang | H01L 21/76224 257/506 |
| 2015/0228474 A1* | 8/2015 | Hanashima | H01L 21/0228 438/778 |
| 2015/0255274 A1* | 9/2015 | Yamamoto | H01L 21/02167 438/765 |
| 2015/0270160 A1* | 9/2015 | Okada | H01L 21/76232 438/435 |

(56) References Cited

U.S. PATENT DOCUMENTS

| | | | | |
|---|---|---|---|---|
| 2015/0303051 A1* | 10/2015 | Takeda | | H01L 21/0228 438/758 |
| 2015/0329970 A1* | 11/2015 | Khan | | H01L 21/67778 118/719 |
| 2015/0332917 A1* | 11/2015 | Sato | | C23C 16/0281 438/685 |
| 2015/0357181 A1* | 12/2015 | Yamamoto | | H01L 21/0228 438/778 |
| 2016/0020089 A1* | 1/2016 | Thadani | | H01L 21/02126 438/786 |
| 2016/0099143 A1* | 4/2016 | Yan | | C23C 16/402 438/782 |
| 2016/0148800 A1* | 5/2016 | Henri | | H01L 21/0228 438/485 |
| 2016/0284542 A1* | 9/2016 | Noda | | H01L 21/02274 |
| 2017/0092486 A1* | 3/2017 | Nitta | | C23C 16/24 |
| 2017/0186603 A1* | 6/2017 | Moon | | C23C 16/30 |
| 2017/0263439 A1* | 9/2017 | Hashimoto | | H01L 21/02362 |
| 2017/0316936 A1* | 11/2017 | Wang | | H01L 21/02126 |
| 2017/0323803 A1* | 11/2017 | van Schravendijk | | H01L 21/02211 |
| 2018/0175150 A1* | 6/2018 | Mauder | | H01L 21/28176 |
| 2018/0182618 A1* | 6/2018 | Blanquart | | H01L 21/0234 |
| 2018/0233349 A1* | 8/2018 | Smith | | C23C 16/04 |
| 2018/0240665 A1* | 8/2018 | Sano | | H01L 21/02126 |
| 2018/0315598 A1* | 11/2018 | Li | | C09D 1/00 |
| 2018/0347047 A1* | 12/2018 | Hashimoto | | C23C 16/52 |
| 2019/0035704 A1* | 1/2019 | Pan | | H01L 21/76807 |
| 2019/0043712 A1* | 2/2019 | Ko | | H01L 27/11582 |
| 2019/0096660 A1* | 3/2019 | Nakatani | | H01L 21/02216 |
| 2019/0103265 A1* | 4/2019 | Kao | | H01L 21/02126 |
| 2019/0103276 A1* | 4/2019 | Peng | | H01L 21/02126 |
| 2019/0103485 A1* | 4/2019 | Peng | | C23C 16/45551 |
| 2019/0157075 A1* | 5/2019 | Tu | | H01L 29/7851 |
| 2019/0348337 A1* | 11/2019 | Pan | | H01L 21/31144 |
| 2020/0006072 A1* | 1/2020 | Peng | | H01L 21/02126 |
| 2020/0043721 A1* | 2/2020 | Liou | | H01L 21/02164 |
| 2020/0058495 A1* | 2/2020 | Ho | | H01L 21/7682 |
| 2020/0058496 A1* | 2/2020 | Li | | C09D 7/61 |

OTHER PUBLICATIONS

"Diffusion of small molecules in amorphous SiO2: effects on the properties of the material and on its point effects", Laura Nuccio, Palermo, Febbraio (Year: 2009).*

* cited by examiner

METHODS OF FORMING SILICON OXIDE LAYER AND SEMICONDUCTOR STRUCTURE

CROSS-REFERENCE TO RELATED APPLICATION

This application claims the priority benefit of U.S. provisional application Ser. No. 62/582,959, filed on Nov. 8, 2017. The entirety of the above-mentioned patent application is hereby incorporated by reference herein and made a part of this specification.

BACKGROUND

Generally, shallow trench isolations (STIs) are used to separate and isolate active areas on a semiconductor wafer from each other. These STIs have historically been formed by etching trenches, sometimes referred to as gaps, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

However, as circuit densities continue to increase, the widths of these gaps decrease, thereby increasing gap aspect ratios, which are typically defined as the gap height divided by the gap width. As a result, it is very difficult to fill these narrow and deep gaps completely with a gap-fill dielectric material. Incomplete filling results in unwanted voids and discontinuities in the gap-fill dielectric material as well as inclusion of unwanted material. These voids and inclusions result in inadequate isolation between active areas. Electrical performance of a device with inadequate isolation is poor and device yield is reduced.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1:
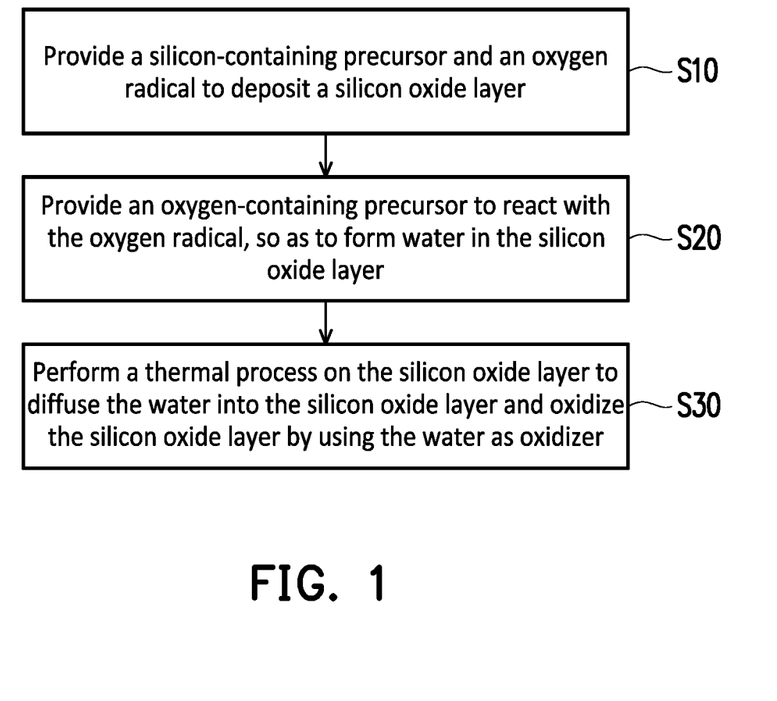
FIG. 1 is a flow chart of a method of forming a silicon oxide layer in accordance with some embodiments of the disclosure.

FIG. 1 is a flow chart of a method of forming a silicon oxide layer in accordance with some embodiments of the disclosure. Referring to FIG. 1, at step S10, a silicon-containing precursor and an oxygen radical are provided to a processing region to deposit a flowable silicon oxide layer in a deposition chamber. In some embodiments, the processing region is a substrate or wafer. In some embodiments, the silicon-containing precursor is a Si-core precursor (i.e., Si atom is a central atom in the structure), N-core precursor (i.e., N atom is a central atom in the structure), a precursor with N—Si—N backbone or a combination thereof. In some embodiments, the Si-core precursor can be written as a formula of $SiH_x(R_1)_y(R_2)_z$, where $R_1$ is $SiH_3$, $R_2$ is $NH_2$, $N(CH_3)_2$ or $N(C_2H_5)_2$, and $x+y+z=4$, $x \geq 0$, $y \geq 0$, and $z \geq 0$. In some embodiments, the Si-core precursor is trisilylamine (TSA) $(SiH(SiH_3)_3)$ or perhydropolysilazanes$(SiH_3(NH_2))$, for example. In some embodiments, the N-core precursor can be written as a formula of $N(SiH_3)_xR_yH_z$, where R is $CH_3$ or $C_2H_5$, and $x+y+z=3$, $x \geq 1$. In some embodiments, the N-core precursor is disilylamine (DSA) $(NH(SiH_3)_2)$, for example. In some embodiments, the precursor with N—Si—N backbone can be written as a formula of $Si(NR)_xH_y$, where R is H, $CH_3$ or $C_2H_5$, and $x+y=4$, $x \geq 2$. In some embodiments, the precursor with N—Si—N backbone is $SiH_2(NC_2H_5)_2$, for example.

In some embodiments, the oxygen radical is generated in a remote plasma system (RPS) outside of the deposition chamber and transported into the processing region of the deposition chamber. The oxygen radical can be generated from an oxygen containing reactant gas such as molecular oxygen ($O_2$), ozone ($O_3$), water vapor ($H_2O$) or hydrogen peroxide ($H_2O_2$).

In some embodiments, an oxygen-free reactant gas may be provided and include $NH_3$, $N_2$, $H_2$, the like, or a combination thereof. In some embodiments, the oxygen-free reactant gas includes nitrogen such as $NH_3$ or $N_2$ and $H_2$. In some embodiments, the oxygen-free reactant gas flows through the remote plasma system (RPS) outside of the deposition chamber and radical thereof is generated and transported into the processing region of the deposition chamber.

One or more carrier gases may also be included. The carrier gases may include helium (He), argon (Ar), nitrogen ($N_2$), the like, or a combination thereof. In some embodiments, the deposition temperature is 40° C. to 150° C., such as 50° C. to 100° C. or 60° C. to 120° C.

Next, at step S20, an oxygen-containing precursor is provided to react with the oxygen radical in the processing region of the deposition chamber, so as to form water in the flowable silicon oxide layer. In some embodiments, the oxygen-containing precursor is free of nitrogen. In some embodiments, the oxygen-containing precursor may be oxysilane, alkoxysilane, the like, or a combination thereof. In some embodiments, the oxysilane can be written as a formula of $Si(OR)_x(OH)_yH_z$, where R is $CH_3$, $C_2H_5$, $C_3H_7$, and $x+y+z=4$, $x\geq 1$. In some embodiments, the oxysilane is $Si(OCH_3)_4$ or $Si(OC_2H_5)_4$. In some embodiments, the oxysilane can also be cyclic type such as $(SiO)_xH_{2x}$, where $4 \leq x \leq 8$, i.e., $(SiO)_4H_8$. In some embodiments, the alkoxysilane can be written as a formula of $Si(CH_3)_x(OR)_yH_z$, where R is $CH_3$, $C_2H_5$, $C_3H_7$, and $x+y+z=4$, $x\geq 1$, $y\geq 1$. In some embodiments, the alkoxysilane is $SiH(CH_3)(OC_2H_5)_2$. In some embodiments, the alkoxysilane can also be cyclic type, $(SiO)_xH_y(CH_3)_z$, where $3 \leq x \leq 8$, $y+z=2x$, i.e., $(SiO)_3(CH_3)$.

The water is a byproduct when the oxygen-containing precursor (such as Si—O—R) reacts with the oxygen radical. In detail, the reaction mechanisms include hydrocarbon oxidation, self-condensation and/or alcohol condensation as shown below.

In the processing region, the silicon-containing precursor deposits a flowable silicon oxide layer on the substrate or wafer present in the processing region, and then the oxygen-containing precursor reacts with the oxygen radical to form water in the flowable silicon oxide layer. Since the silicon layer has flowable characteristic, the formed water can easily diffuse into the flowable silicon oxide layer, and the formed water is substantially dispersed and inserted throughout the flowable silicon oxide layer. In addition, the flowable nature of the flowable silicon oxide layer allows the layer to flow into narrow gaps, trenches and other structures on the processing region of the substrate/wafer.

In some embodiments, before inserting the water into the flowable silicon oxide layer, the flowable silicon oxide layer contains nitrogen, and N—H bond and Si—O bond in the layer can be characterized by FTIR ([N—H]: 3260-3450 $cm^{-1}$, FWHM=180~220 $cm^{-1}$; [Si—O]: 1010-1080 $cm^{-1}$, FWHM=60~100 $cm^{-1}$) with a peak height ratio as $[N—H]_{peak}/[Si—O]$: In some embodiments, the peak height ratio of $[N—H]_{peak}/[Si—O]_{peak}$ is larger than 0.02, for example. In some embodiments, the peak height ratio of $[N—H]_{peak}/[Si—O]_{peak}$ is 0.04 to 0.06 or 0.035 to 0.07.

After the water is formed by the oxygen-containing precursor and an oxygen radical, the flowable silicon oxide layer contains $H_2O$, and the water bond in the layer can be characterized by FTIR ([$H_2O$]: 3250-3420 $cm^{-1}$, FWHM=400~500 $cm^{-1}$) with a peak height ratio as $[H_2O]_{peak}/[Si—O]_{peak}$. In some embodiments, the peak height ratio of $[H_2O]_{peak}/[Si—O]_{peak}$ is larger than 0.05, for example. In some embodiments, the peak height ratio of $[H_2O]_{peak}/[Si—O]_{peak}$ is 0.12 to 0.165 or 0.135 to 0.175.

Figure 2:
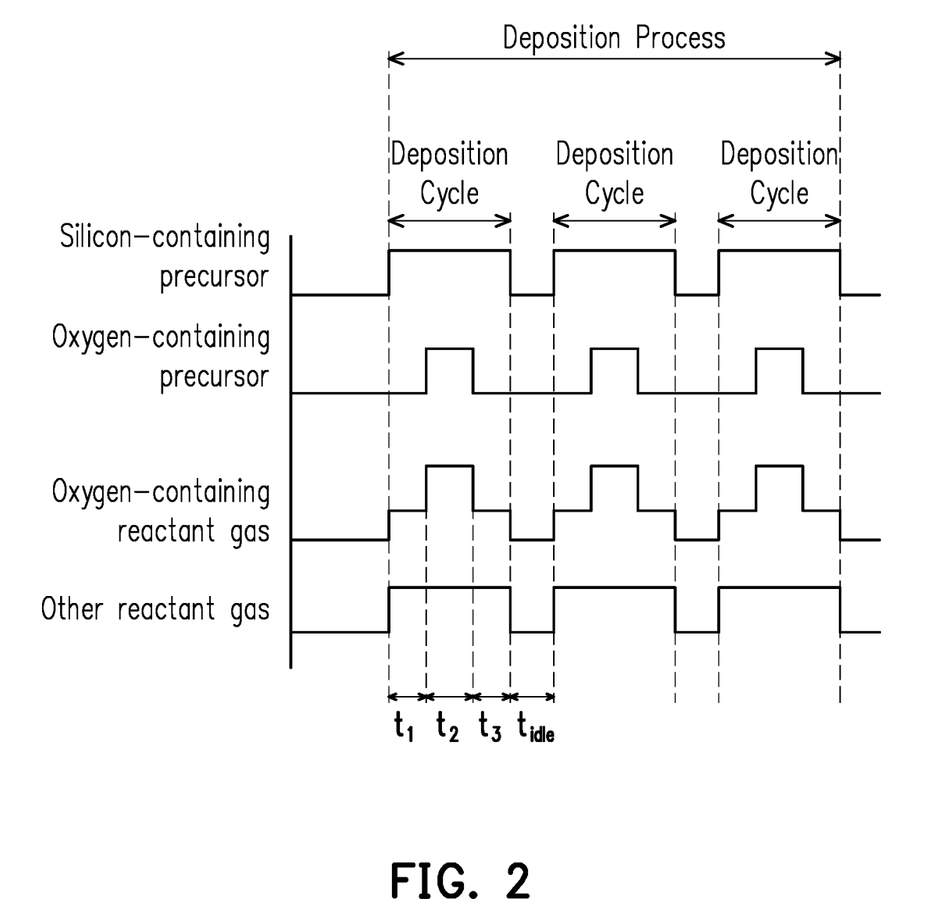
FIG. 2 shows a timing diagram of a method of forming a silicon oxide layer in accordance with some embodiments of the disclosure.

FIG. 2 shows a timing diagram of a method of forming a silicon oxide layer in accordance with some embodiments of the disclosure. The deposition process is basically formed by repeating at least one deposition cycle. The deposition cycle includes time periods $t_1$-$t_3$, for example. During the whole deposition cycle from the start of the time period $t_1$ to the ending of the time period $t_3$, the silicon-containing precursor and the oxygen-containing reactant gas are provided into the deposition chamber with a constant amount, and the flowable silicon oxide layer is deposited. In addition, during the whole deposition cycle, the oxygen-containing reactant gas is provided to flow through the RPS to generate the oxygen radical and other radical(s). The oxygen-free reactant gas is provided with a constant amount during the whole deposition cycle, and the oxygen-containing reactant gas is provided with an increased amount during the time period $t_2$. In the time period $t_2$ which is between the time period $t_1$ and the time period $t_3$, the oxygen-containing precursor is provided into the deposition chamber with a constant amount. In some embodiments, assuming that the silicon oxide layer is formed by depositing multiple silicon oxide layers onto one another, during the time period $t_1$, a first silicon oxide layer is formed by the silicon-containing precursor and the oxygen-containing reactant gas, for example. During the time period $t_2$, a second silicon oxide layer is formed over the first silicon oxide layer by the silicon-containing precursor and the oxygen-containing reactant gas. In addition, during the time period $t_2$, the oxygen-containing precursor reacts with the oxygen radical to form water in the second silicon oxide layer. The steps of the deposition of the second silicon oxide layer and the formation of the water into the second silicon oxide layer are not separated substantially, and deposition of the second silicon oxide layer and formation of the water may occur simultaneously, which allows the water to diffuse into the second silicon oxide layer easily. During the time period $t_3$, a third silicon oxide layer is formed over the second silicon oxide layer containing the water by the silicon-containing precursor and the oxygen-containing reactant gas.

In some embodiments, the flow of oxygen radical is controlled and optimized to react with the oxygen-containing precursor to form a certain amount of water. In other words, in contrast to the silicon-containing precursor provided during the whole deposition cycle, the oxygen-containing precursor is periodically provided accompanied with the optimized flow of oxygen radical for flowability tuning and control of water amount. In some embodiments, the time periods $t_1$-$t_3$ may have a relationship of $0.25 < t_2/(t_1+t_3) < 4$ such as $t_2/(t_1+t_3)=1$ or 0.8, but the disclosure is not limited thereto. The deposition cycle is completed at the ending of the time period $t_3$. In some embodiments, an idle time period $t_{idle}$ is between the adjacent two deposition cycles. During the idle time period $t_{idle}$, the silicon-containing precursor, the oxygen-containing reactant gas, the oxygen-free reactant gas and the oxygen-containing precursor are all ceased to provide, which allows the flowable silicon oxide layer to flow, and thus the flowability of the flowable silicon oxide layer containing the water can be improved. In some alternative embodiments, the idle time period $t_{idle}$ may be 0, for example. In other words, the silicon-containing precursor, the oxygen-containing reactant gas and the oxygen-free reactant gas can be consistently provided in two continuous deposition cycles without being ceased. The deposition cycle is repeated until a desired thickness of material has deposited onto the at least one substrate in the deposition chamber. In FIG. 2, three deposition cycles are illustrated, but the disclosure is not limited thereto.

Then, at step S30, after the deposition process, a thermal process is performed on the silicon oxide layer to diffuse the water into the silicon oxide layer and oxidize the silicon oxide layer by using the water as oxidizer. In some embodiments, the water in the second silicon oxide layer diffuses into the first, second and third silicon oxide layers, for example. In some embodiments, since the water is formed in the flowable silicon oxide layer before performing the thermal process, the flowable silicon oxide layer can be converted to a silicon oxide layer having high structural integrity with a high transition rate. In an embodiment, after the oxidation, the silicon oxide layer consists essentially of silicon and oxygen. In some embodiments, the thermal process makes the flowable silicon oxide layer fully transform into the silicon oxide layer with higher density, stronger mechanical strength and less wet etch loss. In some embodiments, the thermal process is an annealing process, and may be performed at temperatures larger than 300° C. The annealing process may be either a wet or dry anneal. The annealing process may be performed for a duration larger than 30 minutes. In some alternative embodiments, in the annealing process, additional oxygen containing gas such as $O_2$, $O_3$ or $H_2O$ may be provided. In some embodiments, the thermal process is performed with a temperature ranging from 400° C. to 450° C. for 30 minutes to 60 minutes in an nitrogen ambient, and in the formed silicon oxide layer, atom percentage of carbon is less than 7% and a dielectric constant ranges from 3.65 to 4.0, for example.

In some embodiments, the thermal process is a curing process. In some embodiments, the curing process is a UV curing process, and the curing process can be performed with an oxygen-containing gas, such as $O_2$, $O_3$, the like, or a combination thereof and a high thermal conductive gas, such as He, Ar, the like, or a combination thereof. In some embodiments, when the thermal process is an annealing process, an additional curing process may be performed after the annealing process, so as to reduce the residual carbon concentration and increase Si—O crosslinking. In some embodiments, the thermal process is performed with a temperature ranging from 550° C. to 650° C. for 30 minutes to 60 minutes in a $H_2O$ ambient, followed by an additional UV curing process at a temperature of 300° C. to 400° C. for 3 minutes to 5 minutes in an $O_2$ or $O_3$ ambient for achieving higher density, and in the formed silicon oxide layer, atom percentage of carbon is less than 2% and a dielectric constant ranges from 3.85 to 4.05, for example.

In some embodiments, after the deposition process, a surface stabilization treatment is performed on the silicon oxide layer. In some embodiments, the surface stabilization treatment is performed by using $NH_3$, $N_2$, $H_2$, or $O_2$ plasma or soaking in $O_3$ or $H_2O$, the like, or a combination thereof.

In some embodiments, by periodically providing the oxygen-containing precursor to react with the oxygen radical, the water is formed and inserted into the formed silicon oxide layer. Therefore, addition of the water is omitted, and high temperature and long period thermal annealing process for driving $H_2O$ is not required. Furthermore, since the water homogeneously diffuses into the silicon oxide layer, high-speed and homogeneous oxidation can be achieved. Accordingly, the characteristics such as carbon content and K value of the formed silicon oxide are improved and allows a higher thermal budget for the rest of the semiconductor manufacturing process.

The above disclosed method of forming flowable layers can be utilized in forming shallow trench isolation (STI) regions and/or inter-layer dielectrics (ILDs) in Metal-Oxide-Semiconductor Field-Effect Transistors (MOSFETs), such as Fin Field-Effect Transistors (FinFETs) or other semiconductor devices.

Figure 3A:
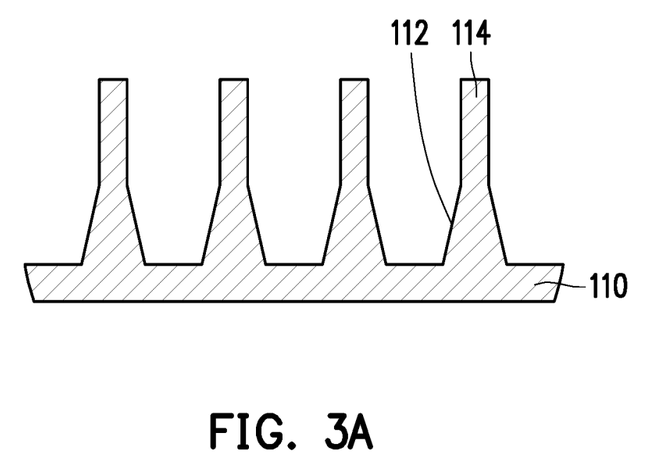
FIGS. 3A to 3D are cross-sectional views of a method of forming a semiconductor structure along a first direction in accordance with some embodiments.
Figure 3B:
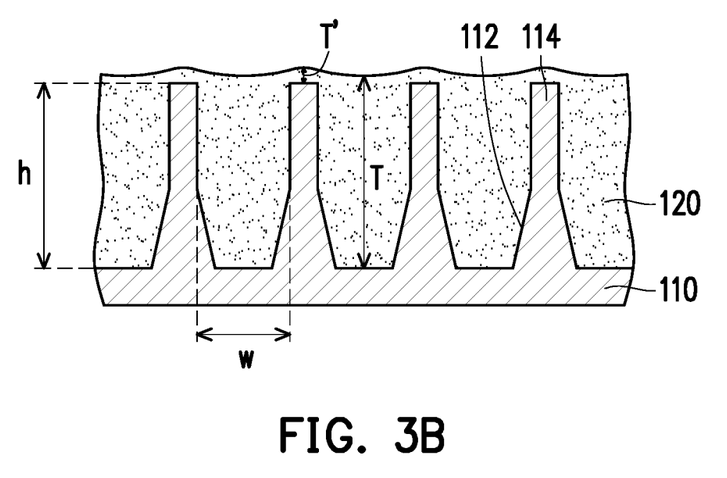
Figure 3C:
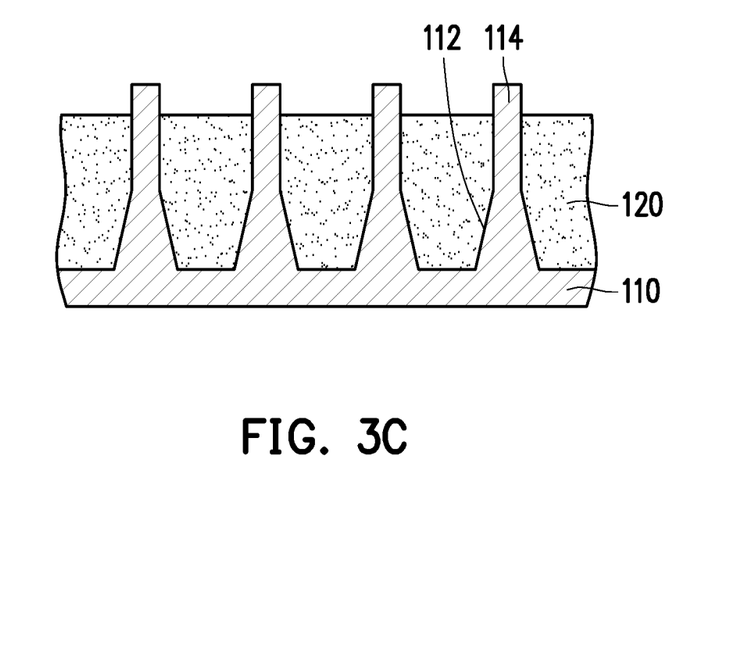
Figure 3D:
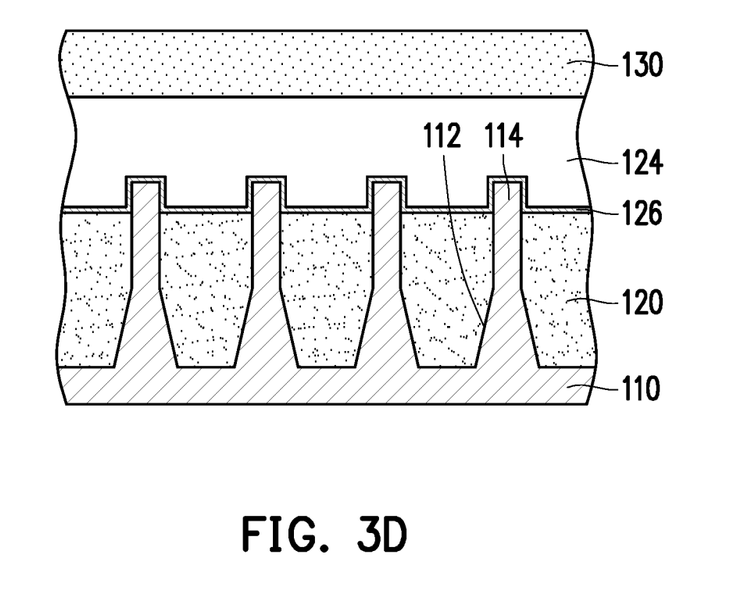
Figure 4:
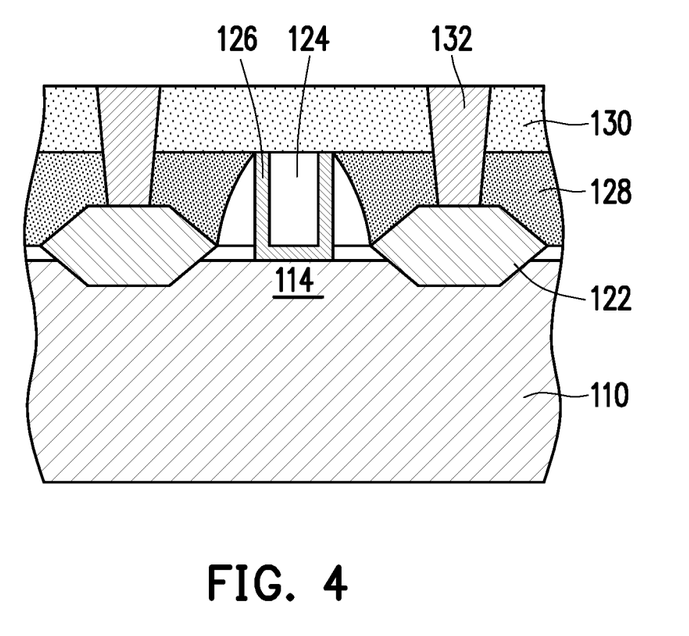
FIG. 4 is a cross-sectional view of a semiconductor structure along a second direction perpendicular to the first direction in accordance with some embodiments.

FIGS. 3A to 3D are cross-sectional views of a method of forming a semiconductor structure along a first direction in accordance with some embodiments. FIG. 4 is a cross-sectional view of a semiconductor structure along a second direction perpendicular to the first direction in accordance with some embodiments, and FIGS. 3D and 4 are cross-sectional view of the same semiconductor structure.

Referring to FIG. 3A, at least one opening 112 is formed in a material layer such as a substrate 110. After removing portions of the substrate 110, 3D structures such as fins 114 are formed in the substrate 110. In some embodiments, the substrate 110 may be a semiconductor substrate, such as a bulk semiconductor, a semiconductor-on-insulator (SOI) substrate, or the like, which may be doped (e.g., with a p-type or an n-type dopant) or undoped. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the openings 112 may be formed by etching trenches in the substrate 110. The etching may be any acceptable etch process, such as a reactive ion etch (RIE), neutral beam etch (NBE), the like, or a combination thereof. The etch may be anisotropic.

Referring to FIG. 3B, an insulating layer 120 is formed to fill the openings 112 and cover the 3D structures such as fins 114. In some embodiments, the insulating layer 120 is formed between neighboring fins 114. In some embodiments, the insulating layer 120 is a silicon oxide layer formed by the method described above in FIGS. 1 and 2 and corresponding paragraphs. In some embodiments, a width w of the opening 112 is larger than 6 nm, and aspect ratio (height h to width w) of the opening 112 is larger than 8, for example. In some embodiments, a flowability is defined as T/T', where T is a mean thickness of the insulating layer 120 filling in the opening 112, and T' is a mean thickness of the insulating layer 120 on a top of the 3D structure such as the fin 114. In some embodiments, the flowability is larger than 5 or 5.5 when the width w is about 100 nm, for example. In some alternative embodiments, the insulating layer 120 may be an oxide formed by any acceptable process, a nitride, the like, or a combination thereof, and the insulating layer 120 may be formed by a high density plasma chemical vapor deposition (HDP-CVD), the like, or a combination thereof.

In some embodiments, the insulating layer 120 outside the opening 112 is removed. In some embodiments, a planarization process, such as a chemical mechanical polish (CMP), may remove any excess insulating layer 120 and form top surfaces of the insulating layer 120 and top surfaces of the fins 114 that are coplanar.

Referring to FIG. 3C, in some embodiments, the insulating layer 120 is recessed, such as to form Shallow Trench Isolation (STI) regions. The insulating layer 120 is recessed such that the fins 114 protrude from between neighboring silicon oxide layers 120. Further, the top surfaces of the insulating layer 120 may have a flat surface as illustrated, a convex surface, a concave surface (such as dishing), or a combination thereof. The top surfaces of the insulating layer 120 may be formed flat, convex, and/or concave by an appropriate etch. The insulating layer 120 may be recessed using an acceptable etching process, such as one that is selective to the material of the insulating layer 120. For example, dilute hydrofluoric (dHF) acid may be used.

Referring to FIGS. 3D and 4, then, a source/drain 122 is partially formed in the substrate 110, a gate 124 is formed on the substrate 110, and a gate dielectric layer 126 formed between the gate 124 and the substrate 110. In some embodiments, the source/drain 122 may be epitaxial source/drain regions and may include silicon, SiC, SiCP, SiP, or the like. The gate 124 may be made of a metal-containing material such as TiN, TaN, TaC, Co, Ru, Al, combinations thereof, or multi-layers thereof. In some alternative embodiments, the gate 124 may be formed by a replacement gate process, that is, a dummy gate is first formed, and then the dummy gate is replaced by a real gate, for example.

An ILD layer 128 is formed in an opening/gap between the source/drain 122 and the gate 124 over the substrate 110. In some embodiments, the ILD layer 128 fills the opening/gap between the source/drain 122 and the gate 124 over the substrate 110, exposes a top surface of the gate 124 and covers a top surface of the source/drain 122. An ILD layer 130 is formed to cover the ILD layer 128, and at least one contact 132 is formed to penetrate the ILD layers 128, 130 to electrically connect the source/drain 122. In some embodiments, the ILD layer 128, 130 may be an oxide, such as silicon oxide, a nitride, the like, or a combination thereof. In some embodiments, the ILD layer 128, 130 is a silicon oxide layer formed by the method described above in FIG. 1 and corresponding paragraphs. In other words, the silicon oxide layer formed by the method described above in FIG. 1 may be formed between the source/drain 122 and the gate 124 and covers the gate 124 or between the contacts 132. In some alternative embodiments, the ILD layer 128, 130 may be formed by a high density plasma chemical vapor deposition (HDP-CVD), the like, or a combination thereof. Other silicon oxides formed by any acceptable process may be used.

Although not explicitly shown, a person having ordinary skill in the art will readily understand that further processing steps may be performed on the structure in FIGS. 3D and 4. For example, various Inter-Metal Dielectrics (IMD) and metal layers in the IMD may be formed over ILD 130.

In some embodiments, the insulating features such as STI regions and/or ILDs in the semiconductor device such as FinFETs may be the silicon oxide layer formed by the method described above in FIG. 1. The flowable nature of the flowable silicon oxide layer allows the film to flow into narrow gaps, trenches and other structures on the deposition surface of the substrate. Accordingly, the formed insulating features have good gap filling property and thus provide good insulation. In addition, the process is simplified, and cost and time for forming the insulating features can be significant reduced.

In some embodiments, a method of forming a silicon oxide layer includes the following steps. A silicon-containing precursor, an oxygen-containing precursor and an oxygen radical are provided to form a silicon oxide layer containing water. A thermal process is performed on the silicon oxide layer to diffuse the water into the silicon oxide layer and oxidize the silicon oxide layer by using the water as oxidizer.

In some embodiments, a method of forming a silicon oxide layer includes the following steps. At least one deposition cycle is performed. The deposition cycle includes: consistently providing a silicon-containing precursor and an oxygen radical to deposit a silicon oxide layer; and periodically providing an oxygen-containing precursor and increasing amount of the oxygen radical to form water in the silicon oxide layer. A thermal process is performed on the silicon oxide layer to diffuse the water into the silicon oxide layer and oxidize the silicon oxide layer by using the water as oxidizer.

In some embodiments, a method of forming a semiconductor structure includes the following steps. An opening is filled with a silicon oxide layer, wherein a method of forming the silicon oxide layer includes the following steps. A silicon-containing precursor, an oxygen-containing precursor and an oxygen radical are provided to form a silicon oxide layer containing water. A thermal process is performed on the silicon oxide layer to diffuse the water into the silicon oxide layer and oxidize the silicon oxide layer by using the water as oxidizer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a silicon oxide layer, comprising:
   performing at least one deposition cycle, comprising:
      consistently providing a silicon-containing precursor and an oxygen radical to deposit a flowable silicon oxide layer; and
      periodically providing an oxygen-containing precursor and increasing amount of the oxygen radical to form water in the flowable silicon oxide layer; and
   performing a thermal process on the flowable silicon oxide layer to diffuse the water into the flowable silicon oxide layer to substantially disperse and insert the water throughout the flowable silicon oxide layer and oxidize the flowable silicon oxide layer by using the water as oxidizer.

2. The method of claim 1, wherein an idle time period is between the deposition cycles, and during the idle time period, the silicon-containing precursor, the oxygen radical and the oxygen-containing precursor are ceased to provide.

3. The method of claim 1, wherein an amount of the silicon-containing precursor is constant during the deposition cycle.

4. The method of claim 1, wherein the oxygen radical is generated from an oxygen-containing gas.

5. The method of claim 1, wherein the water is formed while the flowable silicon oxide layer is deposited.

6. The method of claim 1, wherein the silicon-containing precursor comprises Si or N as a central atom or an N—Si—N backbone.

7. The method of claim 1, wherein the oxygen-containing precursor comprises oxysilane or alkoxysilane.

8. The method of claim 1, wherein the flowable silicon oxide layer is formed by a flowable chemical vapor deposition process.

9. A method of forming a silicon oxide layer, comprising:
providing a silicon-containing precursor and an oxygen radical to deposit a flowable silicon oxide layer;
providing an oxygen-containing precursor and increasing amount of the oxygen radical to form water in the flowable silicon oxide layer; and
homogeneously diffusing the water into the flowable silicon oxide layer to disperse the water throughout the flowable silicon oxide layer.

10. The method of claim 9, wherein the silicon-containing precursor comprises Si or N as a central atom or an N—Si—N backbone.

11. The method of claim 9, wherein the oxygen-containing precursor comprises hydrogen.

12. The method of claim 9, wherein the oxygen-containing precursor comprises oxysilane or alkoxysilane.

13. The method of claim 9, wherein the oxygen-containing precursor is free of nitrogen.

14. The method of claim 9, wherein diffusing the water into the flowable silicon oxide layer comprises performing an annealing process, a curing process or a combination thereof.

15. A method of forming a semiconductor structure, comprising:
filling an opening with a silicon oxide layer, wherein a method of forming the silicon oxide layer comprising:
performing at least one deposition cycle, comprising:
consistently providing a silicon-containing precursor and an oxygen radical to deposit a flowable silicon oxide layer; and
periodically providing an oxygen-containing precursor and increasing amount of the oxygen radical to form water in the flowable silicon oxide layer; and
performing a thermal process on the flowable silicon oxide layer to homogeneously diffuse the water into the flowable silicon oxide layer to disperse the water throughout the flowable silicon oxide layer and oxidize the flowable silicon oxide layer by using the water as oxidizer.

16. The method of claim 15, wherein the silicon-containing precursor comprises Si or N as a central atom or an N—Si—N backbone.

17. The method of claim 15, wherein the oxygen-containing precursor comprises oxysilane or alkoxysilane.

18. The method of claim 15, wherein the oxygen-containing precursor is free of nitrogen.

19. The method of claim 15, wherein the flowable silicon oxide layer is deposited by a flowable chemical vapor deposition process.

20. The method of claim 15, wherein the semiconductor structure is a shallow trench isolation or an inter-layer dielectric.

* * * * *